United States Patent
Xi et al.

(10) Patent No.: US 7,795,984 B2
(45) Date of Patent: Sep. 14, 2010

(54) MAGNETIC OSCILLATOR WITH MULTIPLE COHERENT PHASE OUTPUT

(75) Inventors: Haiwen Xi, Prior Lake, MN (US); Dian Song, Eden Prairie, MN (US); Song S. Xue, Edina, MN (US)

(73) Assignee: Seagate Technology, LLC, Scotts Valley, CA (US)

( * ) Notice: Subject to any disclaimer, the term of this patent is extended or adjusted under 35 U.S.C. 154(b) by 184 days.

(21) Appl. No.: 12/132,676

(22) Filed: Jun. 4, 2008

(65) Prior Publication Data

US 2009/0302953 A1 Dec. 10, 2009

(51) Int. Cl.
*H03B 15/00* (2006.01)
*H03B 27/00* (2006.01)

(52) U.S. Cl. .................. 331/94.1; 331/45; 331/187

(58) Field of Classification Search .......... 331/45, 331/86, 79, 107 DP, 107 SL, 107 T, 187, 331/96, 94.1; 257/421; 324/236, 237, 238, 324/76.14, 76.56, 316
See application file for complete search history.

(56) References Cited

U.S. PATENT DOCUMENTS

| 2006/0193401 A1 | 8/2006 | Lopez Villegas |
| 2007/0047294 A1 | 3/2007 | Panchula |
| 2007/0200641 A1 | 8/2007 | Sen |
| 2007/0285184 A1 * | 12/2007 | Eyckmans et al. ...... 331/107 R |
| 2008/0150643 A1 * | 6/2008 | Suzuki et al. ........... 331/107 R |

FOREIGN PATENT DOCUMENTS

WO WO 2005064783 A2 * 7/2005

OTHER PUBLICATIONS

Xi et al., Circular Domain Wall Motion Driven by Spin-Polarized Currents in Confined Square Nonomagnets, Journ. of Appl. Phys. 97, 044306 (2005).
Silva et al., Inductive Measurement of Ultrafast Magnetization Dynamics in Thin-Film Permalloy, Journ. of Appl. Phys. 85, No. 11 (1999).
Covington, et al., Time-Resolved Measurement of Propagating Spin Waves in Ferromagnetic Thin Films, Physical Review Letters, vol. 89, No. 23 (2002).
Kiselev, Microwave Oscillations of a Nanomagnet Driven by a Spin-Polarized Current, Letters to Nature (2003).
Houssameddine et al., Spin-Torque Oscillator Using a Perpendicular Polarizer and a Planar Free Layer, 2007 Nature Publishing Group, Apr. 2007.

* cited by examiner

*Primary Examiner*—Robert Pascal
*Assistant Examiner*—Ryan Johnson
(74) *Attorney, Agent, or Firm*—Campbell Nelson Whipps LLC

(57) ABSTRACT

Apparatus to generate signals with multiple phases are described. The apparatus includes a fixed multilayer stack providing a varying magnetic field and at least two sensors adjacent the fixed multilayer stack to sense the varying magnetic field and generate at least two output signals. The frequency of the output signals can be tuned by an input current.

20 Claims, 5 Drawing Sheets

MAGNETIC OSCILLATOR WITH MULTIPLE COHERENT PHASE OUTPUT

BACKGROUND

Systems that generate multiple coherent phase output are useful in a number of applications. One exemplary useful application is in signal modulation.

Modulation types currently used in digital communication systems include amplitude modulation, frequency modulation and phase modulation. The phase modulation type, that is, a phase shift keying (PSK) type, is the signal modulation technology currently adopted in most mobile communication systems.

The simplest PSK signal is the linear or binary PSK signal. In this case, the carrier phase is shifted between two possible states, 0 degree (bit "0") and 180 degrees (bit "1"). In a quadrature PSK scheme, four logic bits can be coded by 0 degree, 90 degrees, 180 degrees, and 270 degrees.

Current PSK transmitters involve an oscillator to generate the carrier signal and a delay to shift the signal phase for another output with a different phase. These transmitters often include complex circuitry that is difficult to scale down to very small dimensions.

BRIEF SUMMARY

The present disclosure relates to a magnetic oscillator apparatus that produces multiple coherent phase outputs. In particular, the magnetic oscillator apparatus generates oscillating signals with multiple coherent phase differences simultaneously. In many embodiments, this apparatus utilizes spin-torque to generate a varying magnetic field or rotating magnetization orientation which is simultaneously sensed by two or more sensors and converted into oscillating signals with coherent phase differences. This apparatus can be utilized in any number of applications including, for example, in telecommunication systems where the modulation method if phase shift keying. In one embodiment, an apparatus includes a fixed multilayer stack providing a varying magnetic field and at least two sensors adjacent the fixed multilayer stack to sense the varying magnetic field and generate at least two output signals. The frequency of the output signals can be tuned by an input current.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a magnetic oscillator apparatus that produces multiple coherent phase outputs. In particular, the magnetic oscillator apparatus generates oscillating signals with multiple coherent phase differences simultaneously. In many embodiments, this apparatus utilizes spin-torque to generate a varying or rotating magnetic field or magnetization orientation which is simultaneously sensed by two or more sensors and converted into ac voltage signals with coherent phase differences. This apparatus can be utilized in any number of applications including, for example, in telecommunication systems where the modulation method if phase shift keying. In one embodiment, an apparatus includes a fixed multilayer stack providing a varying magnetic field and at least two sensors spaced about the fixed multilayer stack to sense the rotating magnetic field and generate at least two output signals. While the present disclosure is not so limited, an appreciation of various aspects of the disclosure will be gained through a discussion of the examples provided below.

Figure 1:
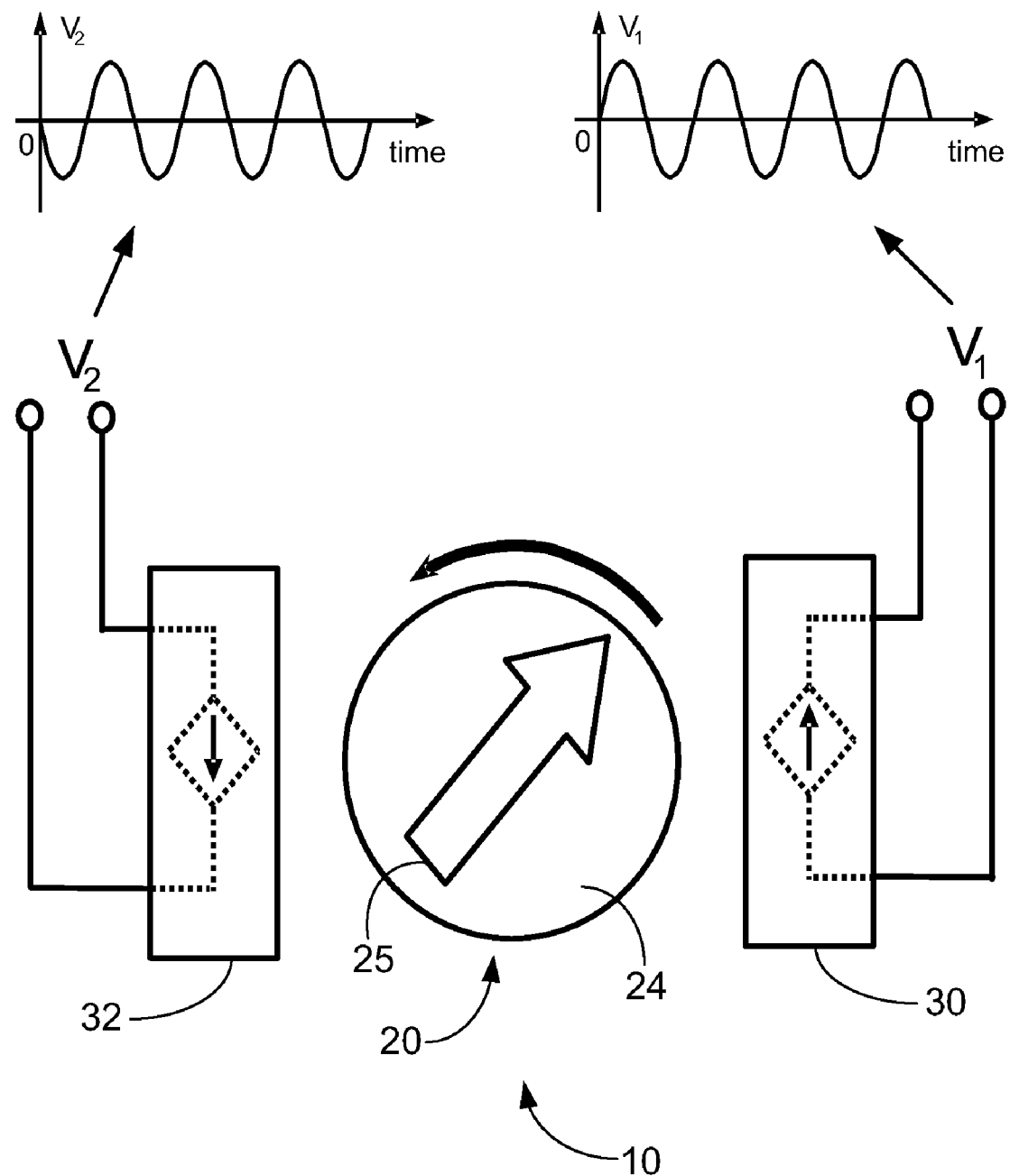
FIG. 1 is a schematic diagram of an illustrative magnetic oscillator generating multiple coherent phase outputs.

FIG. 1 is a schematic diagram of an illustrative magnetic oscillator generating multiple coherent phase outputs. FIG. 1 can be a top view schematic diagram of an illustrative magnetic oscillator apparatus 10 generating multiple coherent phase outputs $V_1$ and $V_2$. The apparatus 10 includes a fixed multilayer stack 20 providing a varying or rotating magnetic field (created by a rotating magnetization orientation 25 of the fixed multilayer stack 20) and at least two sensors 30, 32 adjacent to or spaced around the fixed multilayer stack 20 to sense the varying magnetic field and generate at least two output signals $V_1$ and $V_2$. In many embodiments, the two sensors 30, 32 are circumferentially arranged about the fixed multilayer stack 20. While the illustrated embodiment shows the magnetization orientation rotating in a counterclockwise direction, the magnetization orientation could rotate in a clockwise direction, as desired. This apparatus 10 is useful for binary or linear phase shift keying applications.

The fixed multilayer stack 20 is between a first sensor 30 and a second sensor 32. The first sensor 30 and a second sensor 32 simultaneous sense the varying magnetic field or rotating magnetization orientation 25 of the fixed multilayer stack 20 and the first sensor 30 and a second sensor 32 simultaneous each produce an output signal $V_1$ and $V_2$ that are oscillating and are out of phase from each other a fixed amount based on the relative location of the first sensor 30 and a second sensor 32 around the fixed multilayer stack 20. In the illustrated embodiment, the first sensor 30 opposes the second sensor 32 and the fixed multilayer stack 20 is interposed between the first sensor 30 the second sensor 32. Thus, the output signal $V_1$ is 180 degrees shifted from the output signal $V_2$. In other embodiments the first sensor 30 and the second sensor 32 are at an angle other than 180 degrees from each other such as, for example from 45 degrees to 135 degrees, or from 60 degrees to 90 degrees, or 45 degrees, 60 degrees, 90 degrees, or 135 degrees from each other and providing a output signal having a coherent phase difference equal to the angle separating the first sensor 30 from the second sensor 32, about the fixed multilayer stack 20.

Figure 3:
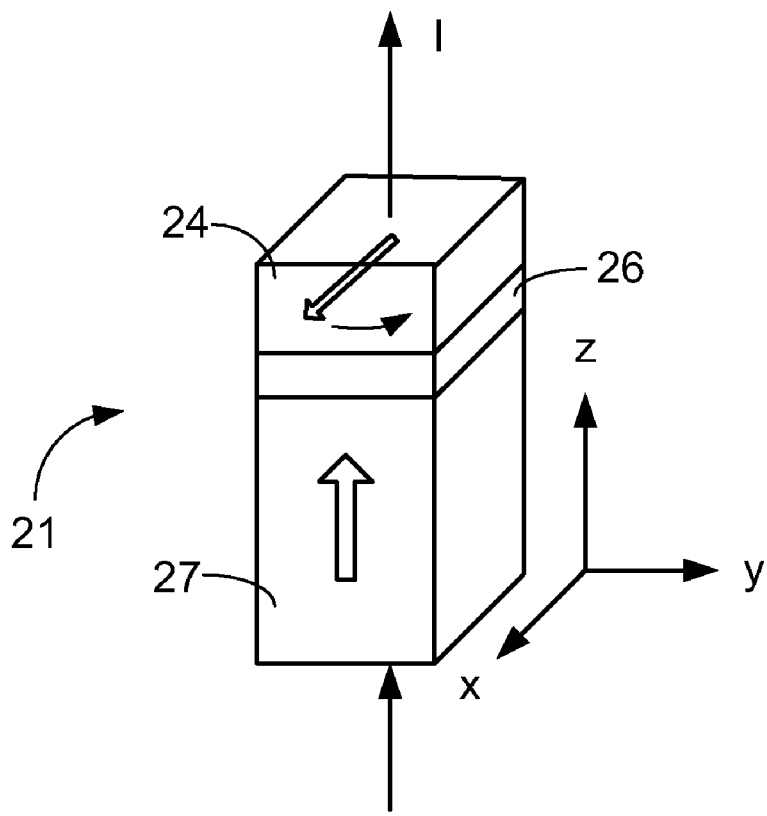
FIG. 3 is a schematic cross-sectional diagram of an exemplary fixed multilayer stack generating a rotating magnetic field.
Figure 4:
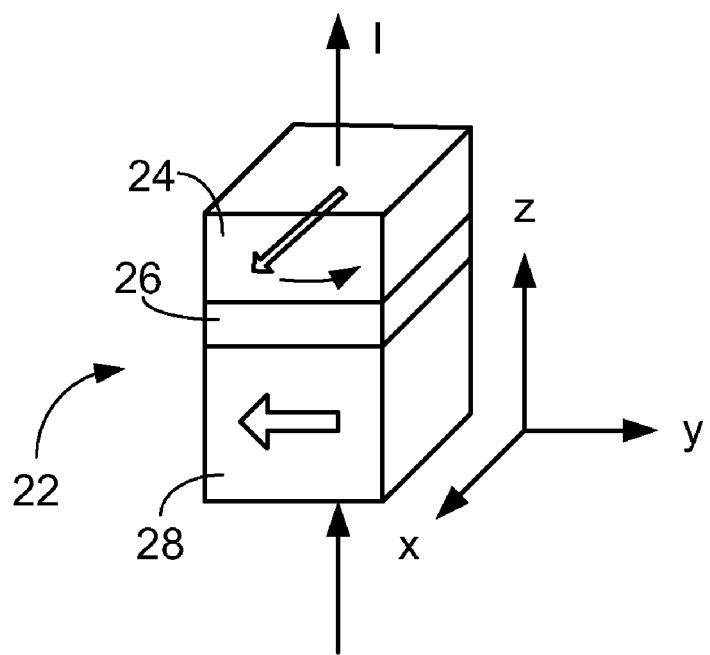
FIG. 4 is a schematic cross-sectional diagram of another exemplary fixed multilayer stack generating a rotating magnetic field.
Figure 5:
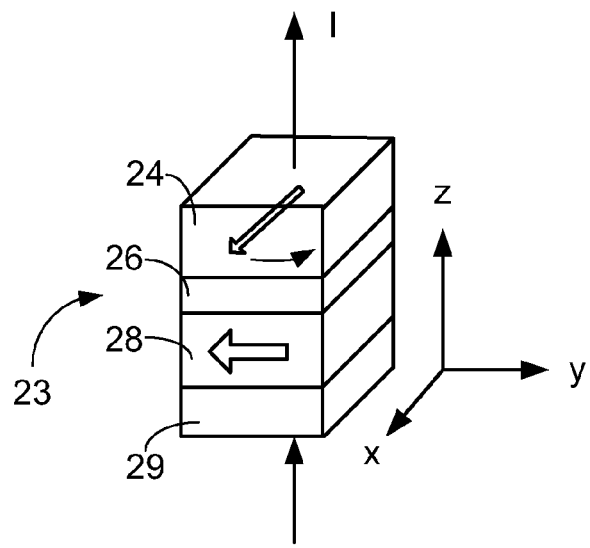
FIG. 5 is a schematic cross-sectional diagram of another exemplary fixed multilayer stack generating a rotating magnetic field.

The fixed multilayer stack 20 can have any useful configuration that produces a varying magnetic field or rotating magnetization orientation 25. A few embodiments of the fixed multilayer stack 20 are illustrated in FIGS. 3-5 described hereinafter. A current passing through the fixed multilayer stack 20 causes the fixed multilayer stack 20 to generate the varying magnetic field (created by a rotating magnetization orientation 25 of the fixed multilayer stack 20). In some embodiments, the fixed multilayer stack 20 magnetic layer has a fixed magnetization spin polarizes direct current passing through the magnetic layer. This spin polarized current exerts a spin torque on a magnetic layer 24 having a "free" magnetization and forces the magnetization orientation 25 to rotate. In other embodiments, spin polarized current is passed through the fixed multilayer stack 20. The spin polarized current exerts a spin torque on a magnetic layer 24 having a "free" magnetization and forces the magnetization orientation 25 to rotate.

The sensors 30, 32 can be any useful magnetic field sensor capable of sensing the rotating magnetic field and generate output signals $V_1$ and $V_2$. In some embodiments, the sensors 30, 32 are magnetic field transducers and can be similar to magnetic field transducers used as magnetic recording read heads used in media drives. The magnetic field transducers can be spin-valve type magnetic field sensors. The magnetic field transducers can be anisotropic magnetoresistance devices, spin-valve giant magnetoresistance devices, or tunneling magnetoresistance devices. In some embodiments, the sensors 30, 32 are coils collecting the magnetic flux change. In some embodiments, the sensors 30, 32 are metallic (e.g., nonmagnetic materials such as Cu and magnetic materials such as permalloy) strips that transmit the magnetic flux (or spin waves) and converts it to a voltage at the output ends of the metallic strips. In many embodiments, the sensors 30, 32 are identical. In some embodiments, the sensors 30, 32 are different. The output signals $V_1$ and $V_2$ can be any useful signal form such as, for example, a voltage value.

Figure 2:
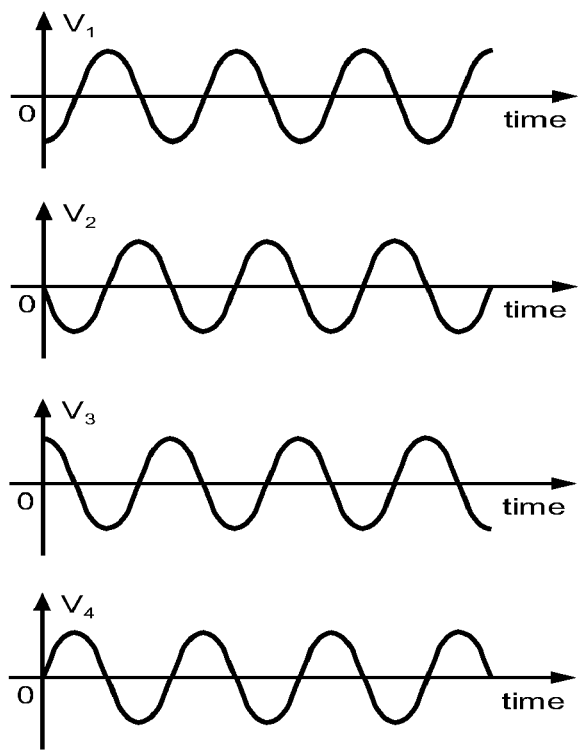
FIG. 2 is a schematic diagram of another illustrative magnetic oscillator generating multiple coherent phase outputs.
Figure 2:
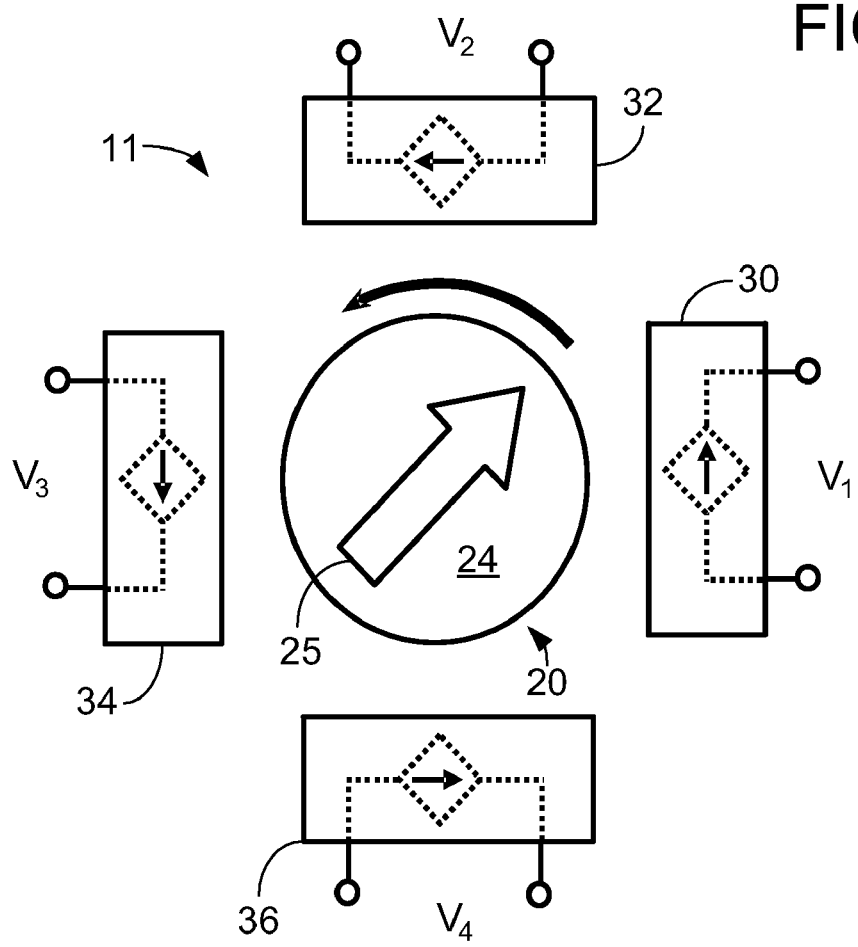

FIG. 2 is a schematic diagram of another illustrative magnetic oscillator generating multiple coherent phase outputs. FIG. 2 can be a top view schematic diagram of an illustrative magnetic oscillator apparatus 11 generating multiple coherent phase outputs $V_1, V_2, V_3, V_4$. The apparatus 11 includes a fixed multilayer stack 20 providing a varying magnetic field (created by a rotating magnetization orientation 25 of the fixed multilayer stack 20) and at least four sensors 30, 32, 34, 36 adjacent to or spaced around the fixed multilayer stack 20 to sense the varying magnetic field and generate at least four output signals $V_1, V_2, V_3, V_4$. In many embodiments, the sensors 30, 32, 34, 36 are circumferentially arranged about the fixed multilayer stack 20. While the illustrated embodiment shows the magnetization orientation rotating in a counterclockwise direction, the magnetization orientation could rotate in a clockwise direction, as desired. This apparatus 11 is useful for quadrature phase shift keying applications.

The fixed multilayer stack 20 is between a first sensor 30, a second sensor 32, a third sensor 30, and a forth sensor 32. The first sensor 30, a second sensor 32, a third sensor 30, and a forth sensor 32 simultaneous sense the varying magnetic field or rotating magnetization orientation 25 of the fixed multilayer stack 20 and the first sensor 30, a second sensor 32, a third sensor 30, and a forth sensor 32 simultaneous each produce an oscillating output signal $V_1, V_2, V_3, V_4$ that are out of phase from each other a fixed amount based on the relative location of the first sensor 30, a second sensor 32, a third sensor 30, and a forth sensor 32 around the fixed multilayer stack 20. In the illustrated embodiment, the first sensor 30 opposes the third sensor 34 and the second sensor 32 opposes the fourth sensor 36 the fixed multilayer stack 20 is interposed between the first sensor 30 the third sensor 34 and between the second sensor 32 and the fourth sensor 36. Thus, the output signals $V_1, V_2, V_3, V_4$ are each separated by 90 degrees. In other embodiments the sensors are at an angle other than 90 degrees from each other.

The fixed multilayer stack 20 can have any useful configuration that produces a varying magnetic field or rotating magnetization orientation 25. A few embodiments of the fixed multilayer stack 20 are illustrated in FIGS. 3-5 described hereinafter. A current passing through the fixed multilayer stack 20 causes the fixed multilayer stack 20 to generate the varying magnetic field (created by a rotating magnetization orientation 25 of the fixed multilayer stack 20). In some embodiments, the fixed multilayer stack 20 magnetic layer having a fixed magnetization spin polarizes direct current passing through the magnetic layer. This spin polarized current exerts a spin torque on a magnetic layer 24 having a "free" magnetization and forces the magnetization orientation 25 to rotate. In other embodiments, spin polarized current is passed through the fixed multilayer stack 20. The spin polarized current exerts a spin torque on a magnetic layer 24 having a "free" magnetization and forces the magnetization orientation 25 to rotate.

The sensors 30, 32, 34, 36 can be any useful magnetic field sensor capable of sensing the varying magnetic field and generate output signals $V_1, V_2, V_3, V_4$. In some embodiments, the sensors 30, 32, 34, 36 are magnetic field transducers and can be similar to magnetic field transducers used as magnetic recording read heads used in media drives. The magnetic field transducers can be spin-valve type magnetic field sensors. The magnetic field transducers can be anisotropic magnetoresistance devices, spin-valve giant magnetoresistance devices, or tunneling magnetoresistance devices. In some embodiments, the sensors 30, 32, 34, 36 are coils collecting the magnetic flux change. In some embodiments, the sensors 30, 32, 34, 36 are metallic (e.g., nonmagnetic materials such as Cu and magnetic materials such as permalloy) strips that transmit the magnetic flux (or spin waves) and converts it to a voltage at the output ends of the metallic strips. In many embodiments, the sensors 30, 32, 34, 36 are identical. In some embodiments, the sensors 30, 32, 34, 36 are different. The output signals $V_1$, $V_2$, $V_3$, $V_4$ can be any useful signal form such as, for example, a voltage value.

In some embodiments the magnetic oscillator apparatus includes three, five, or more sensors surrounding the fixed multilayer stack.

FIG. 3 is a side view schematic diagram of an exemplary fixed multilayer stack 21 generating a varying magnetic field. The fixed multilayer stack 21 includes a nonmagnetic layer 26 separating to magnetic layers 27, 24. The fixed multilayer stack 21 has a thickness direction (z-direction), and length (y-direction) and width x-direction). A current I (direct current) passes through the thickness direction (z-direction) of the fixed multilayer stack 21 to generate the varying magnetic field. While the fixed multilayer stack 21 is illustrated as an elongated cubic form, the fixed multilayer stack 21 can take any useful shape. In some embodiments, the magnetization in the z-direction can be achieved by shape anisotropy associated with greater z-dimension. In some embodiments, magnetization in the z-direction can be achieved by magnetic anisotropy that is intrinsic to the material. Electrodes (not shown) can be in contact with the ends of the fixed multilayer stack 21 to assist in passing current through the fixed multilayer stack 21. While the fixed multilayer stack 21 can have any useful dimension, these structures can be formed on the nanometer scale.

The nonmagnetic layer 26 is a barrier or spacer layer that has a thickness less than the spin diffusion length. Thus, spin polarization of the current I is conserved when it passes through the nonmagnetic layer 26 into the magnetic layer 24. The nonmagnetic layer 26 may be made of an insulator material such as $Al_2O_3$ or MgO or of a nonmagnetic metal such as Cu. Other suitable materials may also be used.

The magnetic layers 27, 24 may be made of ferromagnetic (FM) alloys such as Fe, Co, Ni. The magnetization direction of one magnetic layer 27 is magnetized (fixed or pinned) in the thickness or z-direction due to shape anisotropy of this element, while the magnetization direction of other magnetic layer 24 is free to rotate under the influence of a spin torque and can be referred to as a "free layer." The first magnetic layer 27 has its magnetization orientation fixed or pinned in a direction perpendicular to the x-y plane of the fixed multilayer stack 21 and the second magnetic layer 24 has its magnetization orientation (rotatable or free) parallel to the x-y plane of the fixed multilayer stack 21. Thus, the first magnetic layer 27 has its magnetization orientation perpendicular to the second magnetic layer 24 magnetization orientation.

When an electron current is injected into the first magnetic layer 27 in the z-direction, it is spin polarized by the first magnetic layer 27. The spin polarization of the current I is conserved when it passes through the nonmagnetic layer 26 into the second magnetic layer 24. Spin transfer torque arises from the s-d interaction between the conductive electrons and the local moments of the magnet. The spin polarized current exerts a torque on the second magnetic layer 24 magnetization orientation and make it rotate in the stack plane. A rotating magnetic field is in turn generated from the rotating magnetization.

FIG. 4 is a side view schematic diagram of another exemplary fixed multilayer stack 22 generating a rotating magnetic field. The fixed multilayer stack 22 includes a nonmagnetic layer 26 separating to magnetic layers 28, 24. The fixed multilayer stack 22 has a thickness direction (z-direction), and length (y-direction) and width x-direction). A spin polarized current I (direct current) passes through the thickness direction (z-direction) of the fixed multilayer stack 22 to generate the rotating magnetic field. While the fixed multilayer stack 22 is illustrated as a cubic form, the fixed multilayer stack 22 can take any useful shape. Electrodes (not shown) can be in contact with the ends of the fixed multilayer stack 22 to assist in passing the spin polarized current through the fixed multilayer stack 22. While the fixed multilayer stack 22 can have any useful dimension, these structures can be formed on the nanometer scale.

The nonmagnetic layer 26 is a barrier or spacer layer that has a thickness less than the spin diffusion length. Thus, spin polarization of the current I is conserved when it passes through the nonmagnetic layer 26 into the magnetic layer 24. The nonmagnetic layer 26 may be made of an insulator material such as $Al_2O_3$ or MgO or of a nonmagnetic metal such as Cu. Other suitable materials may also be used.

The magnetic layers 28, 24 may be made of ferromagnetic (FM) alloys such as Fe, Co, Ni. The magnetization direction of one magnetic layer 28 is magnetized (fixed or pinned) in the a direction parallel to the x-y plane of the fixed multilayer stack 22, while the magnetization direction of other magnetic layer 24 is free to rotate under the influence of a spin torque and can be referred to as a "free layer." The second magnetic layer 24 has its magnetization orientation (rotatable or free) parallel to the x-y plane of the fixed multilayer stack 22. Thus, the first magnetic layer 28 has its magnetization orientation parallel to the second magnetic layer 24 magnetization orientation.

When a spin polarized electron current I is injected into the fixed multilayer stack 22 in the z-direction, the spin polarization of the current I is conserved when it passes through the nonmagnetic layer 26 into the second magnetic layer 24. Spin transfer torque arises from the s-d interaction between the conductive electrons and the local moments of the magnet. The spin polarized current exerts a torque on the second magnetic layer 24 magnetization orientation and make it rotate in the stack plane. A varying magnetic field is in turn generated from the rotating magnetization FIG. 5 is a side view schematic diagram of another exemplary fixed multilayer stack 23 generating a varying magnetic field. The fixed multilayer stack 23 includes a nonmagnetic layer 26 separating to magnetic layers 28, 24. The fixed multilayer stack 23 has a thickness direction (z-direction), and length (y-direction) and width x-direction). A spin polarized current I (direct current) passes through the thickness direction (z-direction) of the fixed multilayer stack 23 to generate the rotating magnetic field. While the fixed multilayer stack 23 is illustrated as a cubic form, the fixed multilayer stack 23 can take any useful shape. Electrodes (not shown) can be in contact with the ends of the fixed multilayer stack 23 to assist in passing the spin polarized current through the fixed multilayer stack 23. While the fixed multilayer stack 23 can have any useful dimension, these structures can be formed on the nanometer scale.

The nonmagnetic layer 26 is a barrier or spacer layer that has a thickness less than the spin diffusion length. Thus, spin polarization of the current I is conserved when it passes through the nonmagnetic layer 26 into the magnetic layer 24. The nonmagnetic layer 26 may be made of an insulator material such as $Al_2O_3$ or MgO or of a nonmagnetic metal such as Cu. Other suitable materials may also be used.

The fixed multilayer stack 23 also includes a pinning layer 29. The pinning layer 29 is an antiferromagnetic layer. The antiferromagnet has two sublattices of magnetic moments pointing in opposite directions. When a ferromagnetic layer (i.e., magnetic layers 28) is in contact with it, the magnetization of the ferromagnet (i.e., magnetic layers 28) is pinned in a direction. So the antiferromagnetic layer is called pining layer 29 and the ferromagnetic layer is called pinned layer 28.

The magnetic layers 28, 24 may be made of ferromagnetic (FM) alloys such as Fe, Co, Ni. The magnetization direction of one magnetic layer 28 is magnetized (fixed or pinned) in the a direction parallel to the x-y plane of the fixed multilayer stack 22, while the magnetization direction of other magnetic layer 24 is free to rotate under the influence of a spin torque and can be referred to as a "free layer." The second magnetic layer 24 has its magnetization orientation (rotatable or free) parallel to the x-y plane of the fixed multilayer stack 22. Thus, the first magnetic layer 28 has its magnetization orientation parallel to the second magnetic layer 24 magnetization orientation.

When a spin polarized electron current I is injected into the fixed multilayer stack 22 in the z-direction, the spin polarization of the current I is conserved when it passes through the nonmagnetic layer 26 into the second magnetic layer 24. Spin transfer torque arises from the s-d interaction between the conductive electrons and the local moments of the magnet. The spin polarized current exerts a torque on the second magnetic layer 24 magnetization orientation and make it rotate in the stack plane. A rotating magnetic field is in turn generated from the rotating magnetization.

Figure 6:
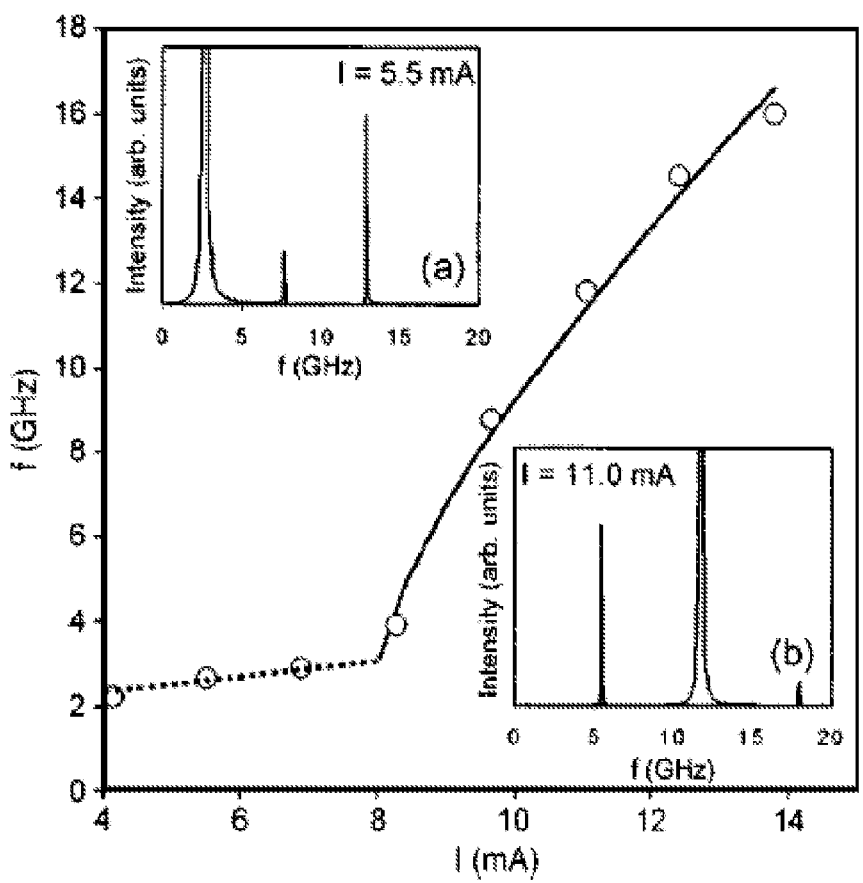
FIG. 6 is a graph illustrating the rotating field frequency as a function of the current flowing through the exemplary fixed multilayer stack shown in FIG. 3.

FIG. 6 is a graph illustrating the rotating field frequency as a function of the current flowing through the exemplary fixed multilayer stack shown in FIG. 3. When a direct current flows through an exemplary fixed multilayer stack 21 a steady varying magnetic field is generated according to FIG. 6. The exemplary fixed multilayer stack free magnetic layer had a lateral size of 90×90 nm$^2$ and a thickness of 7 nm and had a saturation magnetization of 1600 emu/cm$^3$, for the Co—Fe alloy.

This graph shows the current dependence of the primary resonance frequency $f$ in the current range from 4 to 14 mA. At first, $f$ increases linearly with increasing current. When the current is greater than a certain value, about 8 mA in this graph, the primary resonance frequency increases rapidly. Inset (a) shows a frequency spectrum of normalized magnetization vector at a current of 5.5 mA. Inset (b) shows a frequency spectrum of normalized magnetization vector at a current of 11.0 mA. Thus, the frequency of the rotating magnetization of the fixed multilayer stack can be tuned by the current flowing through the multilayer stack.

Figure 7:
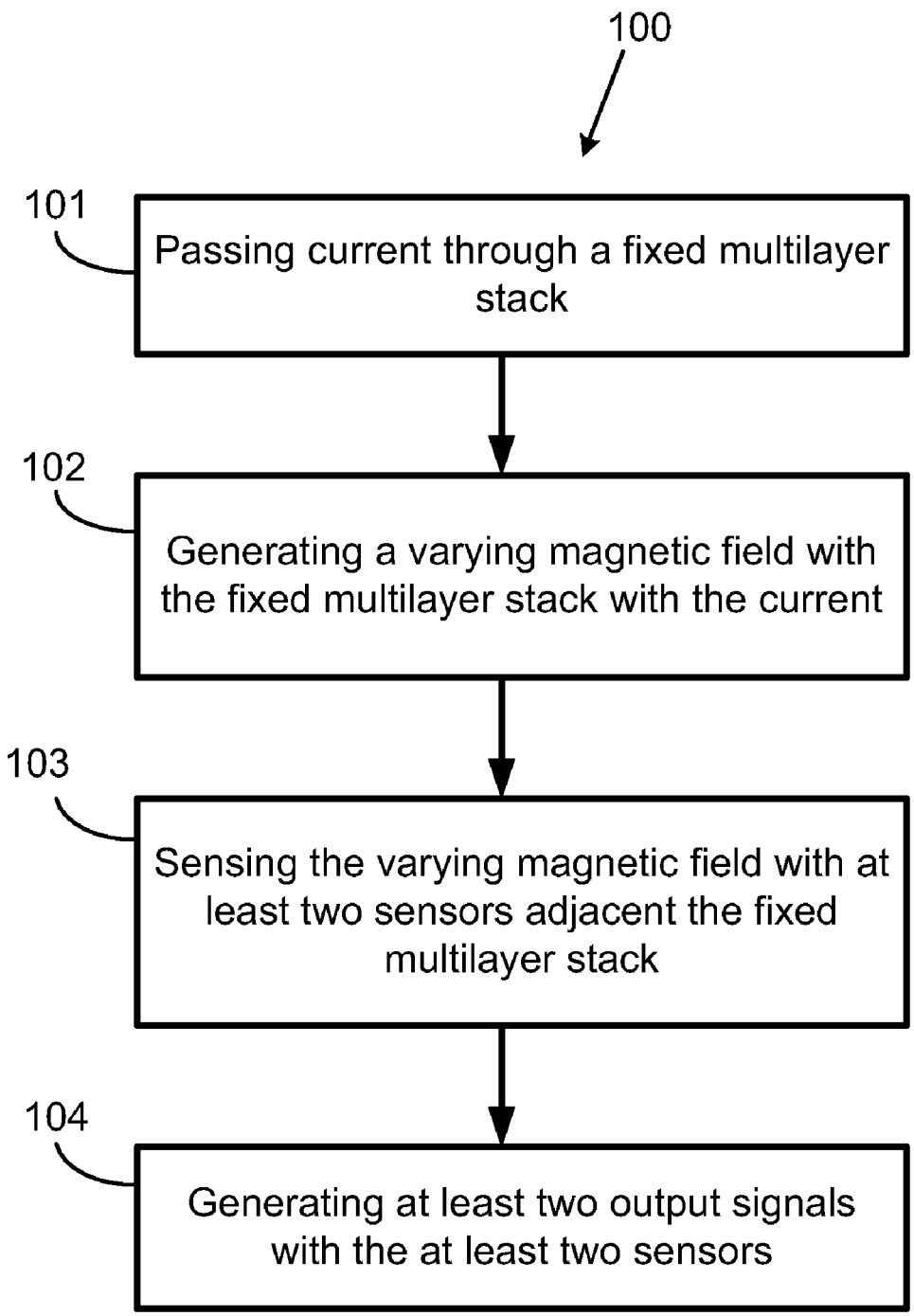
FIG. 7 is a flow diagram of an illustrative method for generating multiple coherent phase outputs.

FIG. 7 is a flow diagram 100 of an illustrative method for generating multiple coherent phase outputs. The method includes passing a current through a fixed multilayer stack at step 101 and generating a varying magnetic field within the fixed multilayer stack with the current at step 102. Then the method includes sensing the varying magnetic field with at least two sensors spaced around the multilayer stack at step 103 and generating at least two output signals with the at least two sensors at step 104.

The passing a current injected into the fixed multilayer stack can be a spin polarized current or the fixed multilayer stack can polarize the current injected into the fixed multilayer stack. The output signals generated by this method can be utilized in a phase shift keying modulation or a quadrature phase shift keying modulation.

Thus, embodiments of the MAGNETIC OSCILLATOR WITH MULTIPLE COHERENT PHASE OUTPUT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. An apparatus to generate signals with multiple phases, comprising:
   a fixed multilayer stack providing a rotating magnetic field;
   at least two sensors adjacent the fixed multilayer stack to sense the rotating magnetic field and generate at least two output signals, where each output signal is out of phase from each other.

2. An apparatus according to claim 1, wherein the rotating magnetic field is formed by passing direct current thorough the fixed multilayer stack.

3. An apparatus according to claim 1, wherein each output signal is an oscillating signal and each output signal is out of phase from each other.

4. An apparatus according to claim 1, wherein the at least two sensor sense the rotating magnetic field and generate the at least two output signals simultaneously.

5. An apparatus according to claim 1, wherein the at least two field sensors are circumferentially arranged around the fixed multilayer stack.

6. An apparatus according to claim 1, wherein the rotating magnetic field is formed with a spin polarized current passing though the fixed multilayer stack.

7. An apparatus according to claim 1, wherein the fixed multilayer stack comprises a non-magnetic barrier layer between a first magnetic layer and a second magnetic layer, the first magnetic layer having a first pinned magnetization orientation and the second magnetic layer having a second free magnetization orientation that is orthogonal to the first magnetization orientation.

8. An apparatus according to claim 1, wherein the fixed multilayer stack comprises a non-magnetic barrier layer between a first magnetic layer and a second magnetic layer, the first magnetic layer having a first pined magnetization orientation plane and the second magnetic layer having a second free magnetization orientation plane that is parallel to the first magnetization orientation plane.

9. An apparatus according to claim 1, wherein the fixed multilayer stack spin polarizes direct current and generates the rotating magnetic field.

10. An apparatus to generate signals with multiple phases, comprising:
    a fixed multilayer stack providing a rotating magnetization orientation;
    at least two magnetic field sensors adjacent the multilayer stack to sense the rotating magnetization orientation and generate at least two output signals, where each output signal is out of phase from each other.

11. An apparatus according to claim 10, wherein the fixed multilayer stack comprises a non-magnetic spacer layer between a first ferromagnetic layer and a second ferromagnetic layer, the first ferromagnetic layer having a first pinned magnetization orientation and the second ferromagnetic layer having a second free magnetization orientation that is orthogonal to the first magnetization orientation.

12. An apparatus according to claim 10, wherein the fixed multilayer stack comprises a non-magnetic spacer layer between a first ferromagnetic layer and a second ferromagnetic layer, the first ferromagnetic layer having a first pined magnetization orientation plane and the second ferromagnetic layer having a second free magnetization orientation plane that is parallel to the first magnetization orientation plane.

13. An apparatus according to claim 10, wherein the rotating magnetization orientation is formed with a spin polarized electron current passing though the fixed multilayer stack.

14. An apparatus according to claim 10, wherein the fixed multilayer stack spin polarizes direct current and generates the rotating magnetization orientation.

15. An apparatus according to claim 10, wherein the at least two sensors sense the rotating magnetization orientation and generate the at least two output signals simultaneously and each output signal is an oscillating signal that is out of phase from each other.

16. A method to generate signals with multiple phases, comprising:

passing a current through a fixed multilayer stack;

generating a rotating magnetic field with the fixed multilayer stack with the current;

sensing the rotating magnetic field with at least two magnetic field sensors adjacent the multilayer stack; and generating at least two output signals with the at least two sensors, where each output signal is out of phase from each other.

17. A method according to claim 16, wherein the generating at least two output signals step comprises generating at least two oscillating output signals, where each oscillating output signal has a different phase, at the same time with the at least two sensors.

18. A method according to claim 16, wherein the passing a current through a fixed multilayer stack step comprises passing a spin polarized current through a fixed multilayer stack.

19. A method according to claim 16, wherein the passing a current through a fixed multilayer stack step comprises passing a current through a fixed multilayer stack forming a spin polarized current.

20. A method according to claim 16, further comprising utilizing the at least two output signals in a phase shift keying modulation or a quadrature phase shift keying modulation.

* * * * *